United States Patent
Oh et al.

(10) Patent No.: US 7,612,969 B2
(45) Date of Patent: Nov. 3, 2009

(54) MAGNETIC MEMORY DEVICE AND METHOD OF FABRICATING THE SAME

(75) Inventors: Se-Chung Oh, Suwon-si (KR); Jang-Eun Lee, Suwon-si (KR); Hyun-Jo Kim, Hwaseong-si (KR); Kyung-Tae Nam, Suwon-si (KR); Jun-Ho Jeong, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 238 days.

(21) Appl. No.: 11/614,268

(22) Filed: Dec. 21, 2006

(65) Prior Publication Data
US 2007/0176251 A1 Aug. 2, 2007

(30) Foreign Application Priority Data
Jan. 27, 2006 (KR) .................... 10-2006-0008675

(51) Int. Cl.
*G11B 5/39* (2006.01)
(52) U.S. Cl. .............................. 360/324.1; 360/324.11; 360/324.12; 29/603.14
(58) Field of Classification Search ................ 257/295, 257/421; 365/158; 360/324.11, 324.2, 324.12, 360/324.1; 438/3, 48; 29/603.14
See application file for complete search history.

(56) References Cited

U.S. PATENT DOCUMENTS

| | | | |
|---|---|---|---|
| 6,165,287 A | | 12/2000 | Sato et al. |
| 6,828,785 B2 | | 12/2004 | Hosomi et al. |
| 2002/0030948 A1* | 3/2002 | Shimazawa ................ 360/320 |
| 2003/0005575 A1* | 1/2003 | Tsuchiya et al. ......... 29/603.07 |
| 2003/0011944 A1* | 1/2003 | Hosomi .................... 360/324.1 |
| 2004/0257719 A1* | 12/2004 | Ohba et al. .............. 360/324.2 |
| 2005/0157544 A1 | 7/2005 | Min et al. |
| 2005/0276099 A1* | 12/2005 | Horng et al. ................ 365/158 |

FOREIGN PATENT DOCUMENTS

| | | |
|---|---|---|
| JP | 10-284768 | 10/1998 |
| JP | 11-168249 | 6/1999 |

(Continued)

OTHER PUBLICATIONS

Title: On the use of exchange biased top electrodes in magnetic tunnel junctions. Authors: D. Lacour, O. Durand, J-L Maurice, H. Jaffres, F. Nguyen Van Dau, F. Petroff, P. Etienne, J. Humbert, A. Vaures. Journal of Magnetism and Magnetic Materials 270 (2004). pp. 403-406.*

(Continued)

*Primary Examiner*—N Drew Richards
*Assistant Examiner*—John P Dulka
(74) *Attorney, Agent, or Firm*—F. Chau & Associates, LLC

(57) ABSTRACT

A magnetic memory device includes a pinning layer, a pinned layer, an insulation layer, which are sequentially stacked on a semiconductor substrate. The magnetic memory device further includes a free layer disposed on the insulation layer, a capping layer disposed on the free layer and an MR (magnetoresistance) enhancing layer interposed between the free layer and the capping layer. The MR enhancing layer is formed of at least one anti-ferromagnetic material.

1 Claim, 3 Drawing Sheets

FOREIGN PATENT DOCUMENTS

| | | |
|---|---|---|
| JP | 2002-353535 | 12/2002 |
| KR | 10-0306312 | 8/2001 |
| KR | 10-0308416 | 8/2001 |
| KR | 1020040078869 | 9/2004 |
| KR | 1020040092706 | 11/2004 |

OTHER PUBLICATIONS

Title: Magnetization switching and tunneling magnetoresistance effects of MTJs with synthetic antiferromagnet free layers consisting of amorphous CoFeSiB. Authors: J. R.Rhee, J.Y.Hwang, S.S.Kim, M.Y.Kim, B.S. Chun, I.S.Yoo, B.S.Oh, Y. K.Kim, T.W.Kim, W.J. Park. IEEE Transactions of magnetics vol. 41 No. 1; Oct. 10, 2005; pp. 2685-2687.*

K. Tsunekawa, D.D Djayaprawira, M. Nagai, H. Machara, S. Yamagata, N. Watanabe; Effect of capping layer material on tunnel magnetoresistance in CoFeB/Mgo/CoFeB magnetic tunnel junctions; Magnetics Conference, 2005. Intermag Asia 2005. Digests of the IEEE International, Oct. 17, 2005; p. 1983-1984 HP08.*

K. Tsunekawa, D.D. Djayaprawira, M. Nagai, H. Maehara, S. Yamagata, N. Watanabe; Effect of capping layer material on tunnel magnetoresistance in CoFeB/MgO/CoFeB magnetic tunnel junctions; Magnetics Conference, 2005. Intermag Asia 2005. Digests of the IEEE International, Oct. 17, 2005; p. 1983-1984 HP08.*

* cited by examiner

MAGNETIC MEMORY DEVICE AND METHOD OF FABRICATING THE SAME

This application relies for priority upon Korean Patent Application No. 2006-08675, filed on Jan. 27, 2006, the contents of which are hereby incorporated by reference herein in their entirety.

BACKGROUND OF THE INVENTION

1. Technical Field

The present disclosure relates to a semiconductor device and to a method of fabricating the same, and more particularly, to a magnetic memory device and to a method of fabricating the same.

2. Description of the Related Art

With the development of the electronics industry including, for example, mobile communications and computers, the demand for semiconductor devices having characteristics such as rapid read/write speed, nonvolatility, and a low operating voltage has increased. However, currently used memory devices, such as a static random access memory (SRAM), a dynamic random access memory (DRAM), and a flash memory, may not satisfy all these requirements.

For example, as a unit cell of the DRAM typically includes a single capacitor and a single transistor for controlling the capacitor, it may require a larger area than a unit cell of a NAND (Not AND) flash memory. Moreover, as is well known in the art, the DRAM, which stores data in the capacitor, is a volatile memory device that needs a refresh operation. Furthermore, the SRAM operates at high speed, but it is also a volatile memory device. Additionally, a unit cell of the SRAM is typically comprised of 6 transistors, so it may occupy a very large area. Further, although the flash memory is a nonvolatile memory device and (especially, for example, the NAND flash memory) has the highest integration density of present memory devices, it still operates at low speeds.

For at least the above-mentioned reasons, there have been extensive studies on new memory devices, such as magnetic random access memories (MRAMs), which are capable of fast read/write operations, exhibit nonvolatility, need no refresh operations, and operate at a low voltage.

Typically, the MRAM includes a magnetic tunnel junction (MTJ) for storing data. For example, referring to FIG. 1, which is a cross sectional view of an MTJ 60 of a conventional MRAM, the MTJ 60 includes a pinning layer 10, a pinned layer 20, an insulation layer 30, a free layer 40, and a capping layer 50. The pinning layer 10 is formed of an anti-ferromagnetic layer, while each of the pinned layer 20 and the free layer 40 is formed of a ferromagnetic layer having a magnetic hysteresis.

In this case, the magnetic polarization of the pinned layer 20 is fixed due to anti-ferromagnetic coupling (AFC) between the pinning layer 10 and the pinned layer 20. However, in the conventional art, as the free layer 40 does not come into contact with any anti-ferromagnetic layer, the magnetic polarization of the free layer 40, unlike the pinned layer 20 is not fixed. Thus, the magnetic polarization of the free layer 40 may be parallel or anti-parallel to that of the pinned layer 20.

As is well known, the electrical resistance of the MTJ 60 is dependent on the magnetic polarizations of the free layer 40 and the pinned layer 20. Specifically, the electrical resistance of the MTJ 60 is greater when the magnetic polarization of the free layer 40 is anti-parallel to that of the pinned layer 20 than when the magnetic polarization of the free layer 40 is parallel to that of the pinned layer 20. The electrical resistance of the MTJ 60, which depends on the magnetic polarizations of the free layer 40 and the pinned layer 20, may be utilized to read data stored in the MRAM. For example, data stored in the MTJ 60 may be read by measuring a current flowing through the MTJ 60.

The magnetic polarization of the free layer 40 may be switched by controlling a magnetic field generated around interconnection lines (e.g., bit lines (BLs) and digit lines (DLs) adjacent to the MTJ 60. As a result, magnetic field applied from external interconnection lines may be used to change the electrical resistance of the MTJ 60. This characteristic is typically referred to as the "magnetoresistance (MR) of the MTJ 60," and the efficiency of the MR is expressed by an MR ratio.

Meanwhile, a conventional method of fabricating an MRAM typically involves thermally treating the MTJ 60 at a temperature of about 360° C. As a result, the free layer 40 is crystallized to enhance the characteristics of the MTJ 60. However, this high-temperature thermal treatment may lead to the intermixture of the free layer 40 and the capping layer 50, thereby sharply reducing the MR ratio. Therefore, there is a need to develop a new technique of inhibiting the intermixture of the free layer 40 and the capping layer 50.

SUMMARY OF THE INVENTION

The exemplary embodiments of the present invention provide a magnetic random access memory (MRAM) with a high magnetoresistance (MR) ratio and a method of fabricating the same.

Also, the exemplary embodiments of the present invention provide an MRAM, which inhibits the intermixture of a free layer and a capping layer, and a method of fabricating the same.

Further, the exemplary embodiments of the present invention provide an MRAM, which has a high MR ratio without causing an increase in a switch field, and method of fabricating the same.

In accordance with an exemplary embodiment of the present invention, a magnetic memory device is provided. The magnetic memory device includes a pinning layer, a pinned layer, an insulation layer, which are sequentially stacked on a semiconductor substrate. The magnetic memory device further includes a free layer disposed on the insulation layer, a capping layer disposed on the free layer and an MR (magnetoresistance) enhancing layer interposed between the free layer and the capping layer. The MR enhancing layer is formed of at least one anti-ferromagnetic material.

According to exemplary embodiments of the present invention, the MR enhancing layer may be formed to such a thickness so as to prevent anti-ferromagnetic coupling (AFC) from occurring between the MR enhancing layer and the free layer. Thus, the MR enhancing layer may be formed to a thickness of about 1 to about 80 Å.

According to exemplary embodiments of the present invention, the MR enhancing layer may be formed of at least one material selected from the group consisting of iridium (Ir), platinum (Pt), iron (Fe), manganese (Mn), cobalt (Co), nickel (Ni), chromium (Cr) and a combination thereof. For example, the MR enhancing layer may be formed of at least one material selected from the group consisting of iridium manganese (IrMn), platinum manganese (PtMn), iron manganese (FeMn), manganese oxide (MnO), manganese sulfide (MnS), manganese telluride (MnTe), manganese fluoride ($MnF_2$), iron fluoride ($FeF_2$), iron chloride ($FeCl_2$), iron oxide (FeO), cobolt chloride $CoCl_2$, cobalt oxide (CoO), nickel chloride ($NiCl_2$), nickel oxide (NiO), and chromium (Cr).

In accordance with an exemplary embodiment of the present invention, a method of fabricating a magnetic memory device is provided. The method includes forming a lower electrode on a semiconductor substrate, forming an MTJ (magnetic tunnel junction) layer on the lower electrode, and forming an MTJ pattern on the lower electrode by patterning the MTJ layer. The MTJ layer includes a pinning layer, a pinned layer, an insulation layer, a free layer, an MR (magnetoresistance) enhancing layer, and a capping layer that are stacked sequentially. Also, the MR enhancing layer is formed using at least one anti-ferromagnetic material to a thickness of about 1 to about 80 Å.

The MR enhancing layer may be formed to such a thickness so as to prevent AFC from occurring between the MR enhancing layer and the free layer. In an exemplary embodiment of the present invention, the MR enhancing layer may be formed to a thickness of about 3 to about 10 Å using one of an atomic layer deposition (ALD) technique and a chemical vapor deposition (CVD) technique.

According to exemplary embodiments of the present invention, the MR enhancing layer may be formed of at least one material selected from the group consisting of iridium (Ir), platinum (Pt), iron (Fe), manganese (Mn), cobalt (Co), nickel (Ni), chromium (Cr) and a combination thereof. For example, the MR enhancing layer may be formed of at least one material selected from the group consisting of IrMn, PtMn, FeMn, MnO, MnS, MnTe, $MnF_2$, $FeF_2$, $FeCl_2$, FeO, $CoCl_2$, CoO, $NiCl_2$, NiO, and Cr.

BRIEF DESCRIPTION OF THE DRAWINGS

Exemplary embodiments of the present can be understood in more detail from the following description taken in conjunction with the accompanying drawings in which.

DETAILED DESCRIPTION OF THE EXEMPLARY EMBODIMENTS

Figure 1:
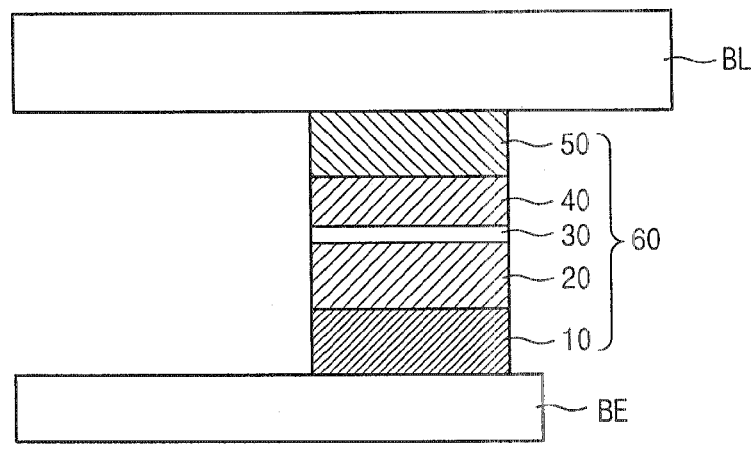
FIG. 1 is a cross sectional view of a magnetic tunnel junction (MTJ) of a conventional magnetic random access memory (MRAM)
Figure 1:

Reference will now be made in detail to the exemplary embodiments of the present invention, examples of which are illustrated in the accompanying drawings. However, the present invention is not limited to the exemplary embodiments illustrated hereinafter.

It will also be understood that when a layer is referred to as being "on" another layer or substrate, it can be directly on the other layer or substrate, or intervening layers may also be present. In the drawings, the thicknesses of layers and regions are exaggerated for clarity. It will be understood that although the terms first and second are used herein to describe various regions, layers and/or sections should not be limited by these terms. These terms are only used to distinguish one region, layer or section from another region, layer or section. Thus, for example, a first layer discussed below could be termed a first layer without departing from the teachings of the present invention. Each exemplary embodiment described and illustrated herein includes complementary embodiments thereof.

Figure 2:
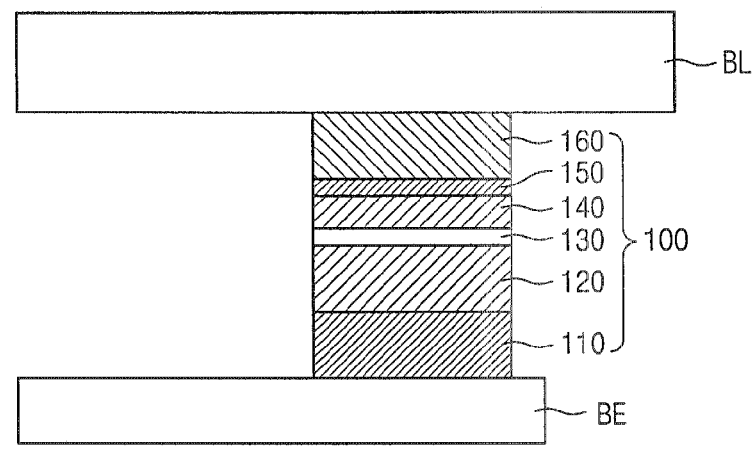
FIG. 2 is a cross sectional view of a magnetic tunnel junction (MTJ) of an MRAM according to an exemplary embodiment of the present invention.
Figure 2:

FIG. 2 is a cross sectional view of a magnetic tunnel junction (MTJ) of a magnetic random access memory (MRAM) according to an exemplary embodiment of the present invention.

Referring to FIG. 2, the MTJ 100 according to an exemplary embodiment of the present invention includes a pinning layer 110, a pinned layer 120, an insulation layer 130, a free layer 140, a magnetoresistance (MR) enhancing layer 150, and a capping layer 160 that are stacked in sequence.

The pinning layer 110 is an anti-ferromagnetic layer, which may be formed of, for example, at least one material selected from the group consisting of platinum manganese (PtMn), iridium manganese (IrMn), manganese oxide (MnO), manganese sulfied (MnS), manganese telluride (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), and chromium (Cr). Preferably, the pinning layer 110 is formed of PtMn.

Also, the pinned layer 120 is a ferromagnetic layer, which may be formed of, for example, at least one material selected from the group consisting of cobalt iron boron (CoFeB), cobalt-iron (CoFe), iron (Fe), cobalt (Co), nickel (Ni), gadolinium (Gd), dysprosium (Dy), nickel iron (NiFe), manganese arsenide (MnAs), manganese-bismuth (MnBi), manganese antimony (MnSb), chromium oxide ($CrO_2$), manganese ferrite ($MnOFe_2O_3$), iron ferrite ($FeOFe_2O_3$), nickel ferrite ($NiOFe_2O_3$), copper ferrite ($CuOFe_2O_3$), magnesium ferrite ($MgOFe_2O_3$), europium oxide (EuO), and yttrium-iron-garnet ($Y_3Fe_5O_{12}$). According to the present exemplary embodiment, the pinned layer 120 may have a trilayer structure including two ferromagnetic layers between which a ruthenium (Ru) layer is interposed. For example, the pinned layer 120 may include a CoFe layer, a Ru layer, and a CoFeB layer that are stacked in sequence. In this case, the CoFe layer may have a thickness of about 70 to about 110 angstroms (Å), and the CoFeB layer may have a thickness of about 40 to about 80 Å.

The insulation layer 130 is formed of an insulating material, which may be, for example, one of magnesium oxide and aluminum oxide. For example, the insulation layer 130 may be magnesium oxide layer with a thickness of about 7 to about 10 Å.

The free layer 140 is a ferromagnetic layer, which is formed of, for example, at least one material selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2$, EuO, and $Y_3Fe_5O_{12}$. For example, the free layer 140 may be a CoFeB layer with a thickness of about 20 to about 40 Å.

The MR enhancing layer 150 may be formed of at least one anti-ferromagnetic material. For instance, the MR enhancing layer 150 may be formed of one material selected from the group consisting of iridium (Ir), platinum (Pt), iron (Fe), manganese (Mn), cobalt (Co), nickel (Ni), chrome (Cr) and a combination thereof, which exhibits anti-ferromagnetism. More specifically, the MR enhancing layer 150 may be formed of at least one material selected from the group consisting of IrMn, PtMn, FeMn, MnO, MnS, MnTe, $MnF_2$, $FeF_2$, $FeCl_2$, FeO, $CoCl_2$, CoO, $NiCl_2$, NiO, and Cr. Preferably, the MR enhancing layer 150 is formed of an anti-ferromagnetic material containing Mn, for example, IrMn, PtMn, and FeMn.

Meanwhile, as discussed, when the free layer 140 is brought into contact with an anti-ferromagnetic material, anti-ferromagnetic coupling (AFC) may occur to hinder switching the magnetic polarization of the free layer 140. Due to the above-mentioned AFC phenomenon, methods for forming an inti-ferromagnetic layer on the free layer 140 according to exemplary embodiments of the present invention have not been considered in the conventional art. However, this AFC difficulty can be prevented by controlling the thickness of the MR enhancing layer 150.

In other words, according to the exemplary embodiments of the present invention, the MR enhancing layer 150 is formed to such a thickness so as to prevent the AFC from occurring between the MR enhancing layer 150 and the free layer 140. Thus, the MR enhancing layer 150 may be formed to a thickness of about 1 to about 80 Å. As stated above, when the MR enhancing layer 150 is formed of an anti-ferromagnetic material containing Mn, such as, for example, IrMn, PtMn, and FeMn, the MR enhancing layer 150 may be formed to a thickness of about 3 to about 10 Å (A more detailed description of the thickness of the MR enhancing layer 150 will be presented later again with reference to simulation results).

The capping layer 160 is formed of a conductive material, such as, for example, tantalum (Ta). A bit line BL is connected to a top surface of the capping layer 160. The bit line BL serves as a path of current flowing through the MTJ 100 in a read operation and also, an interconnection line that generates a magnetic field for controlling the magnetic polarization of the free layer 140 in a write operation. Further, a lower electrode BE is disposed under the pinning layer 110 and electrically connected to a drain region of a transistor. The pinning layer 110 is in direct contact with the lower electrode BE. A digit line DL is disposed below the MTJ 100 such that the digit line DL is spaced apart from the lower electrode BE across the bit line BL. The magnetic polarization of the free layer 140 is controlled by the strengths and polarizations of magnetic fields around the bit line BL and the digit line DL, respectively.

Figure 3:
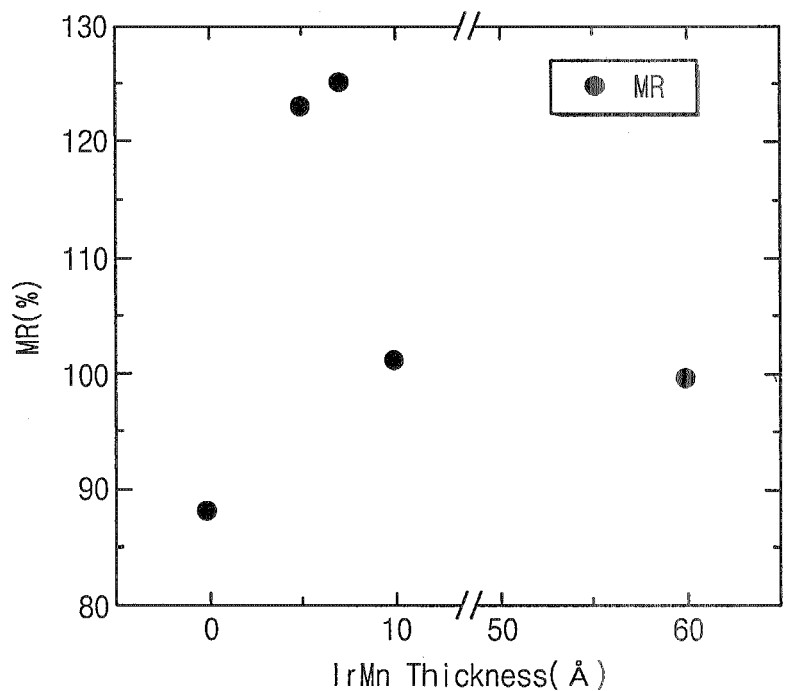
FIG. 3 is a graph of simulation results showing a magnetoresistance (MR) ratio with respect to the thickness of an MR enhancing layer according to an exemplary embodiment of the present invention.
Figure 4:
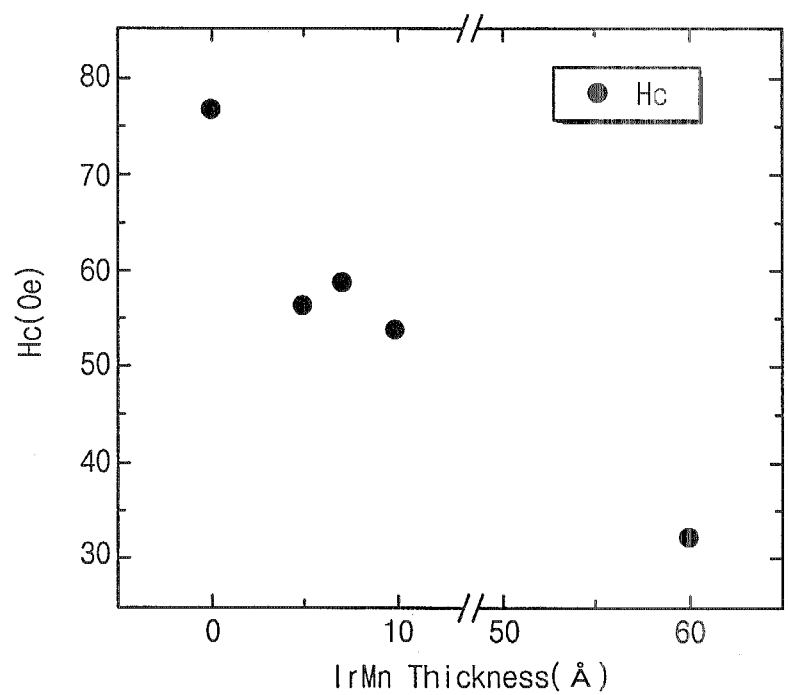
FIG. 4 is a graph of simulation results showing a switch field with respect to the thickness of the MR enhancing layer according to an exemplary embodiment of the present invention.

FIG. 3 is a graph of simulation results showing an MR ratio with respect to the thickness of an MR enhancing layer according to an exemplary embodiment of the present invention, and FIG. 4 is a graph of simulation results showing a switch field with respect to the thickness of the MR enhancing layer according to an exemplary embodiment of the present invention. In FIGS. 3 and 4, simulations were conducted wherein the pinning layer 110 and the pinned layer 120 of the MTJ 100 were formed of PtMn and CoFe/Ru/CoFeb, respectively. The insulation layer 130 and the free layer 140 were formed of MgO and CoFeB, respectively, and the MR enhancing layer 150 and the capping layer 160 were formed of IrMn and Ta, respectively. Also, the simulation results were obtained using the MTJ 100 that was annealed at a temperature of about 360° C. In FIG. 3, an abscissa denoted the thickness of the MR enhancing layer 150, while an ordinate denotes the MR ratio. In FIG. 4, an abscissa denotes the thickness of the MR enhancing layer 150, while an ordinate denotes the strength of minimum magnetic field (e.g., switch field).

Referring to FIG. 3, when the MR enhancing layer 150 was not used (e.g., in the conventional case), the MR ratio of the MTJ 100 was about 88%. In comparison, when the MR enhancing layer 150 was about 5 to about 7 Å thick, the MR ratio of the MTJ 100 increased to about 125%. However, when the MR enhancing layer 150 was about 10 Å thick or more, the MR ratio of the MTJ 100 decreased to about 100%.

Considering the forgoing results, it can be seen that use of the MR enhancing layer 150 may lead to an increase in the MR ratio of the MTJ 100. However, as the MR ratio was the greatest when the MR enhancing layer 150 was no greater that about 10 Å, the MR enhancing layer may be formed to a thickness of about 3 to about 10 Å. On the other hand, when the MR enhancing layer 150 is formed of an anti-ferromagnetic material other than used in the present simulation, the required thickness of the MR enhancing layer 150 may be changed.

Referring to FIG. 4, when the MR enhancing layer 150 was not used, the switch field strength was about 77 oersteds (Oe). In comparison, when the MR enhancing layer 150 was about 5 Å thick, the switch field strength decreased to about 56 Oe, and it can be observed that as the thickness of the MR enhancing layer 150 increased, the switch field strength gradually decreased. As a result, it can be seen that when the MR enhancing layer 150 was used, the magnetic field strength required to change data stored in the MTJ 100 was reduced. Considering that the magnetic field strength is dependent on the amount of current flowing through a line, a reduction in the required magnetic field strength is beneficial in lessening consumed power. Further, when the magnetic polarization of the free layer 140 is switched by spin-torque transfer, the critical current density required to switch the magnetic polarization of the free layer 150 may decrease with an increase in magnetization. Therefore, when the MR ratio is increased with the increase in magnetization like as the aforementioned case of IrMn, the critical current density of the spin-torque transfer can decrease.

Meanwhile, when the MR enhancing layer 150 is about 80 Å or more, AFC may occur between the free layer 140 and the MR enhancing layer 150. Considering this fact and the foregoing simulation results, the MR enhancing layer 150 may be formed to a thickness of about 1 to about 80 Å. More preferably, the MR enhancing layer 150 is formed to a thickness of about 3 to about 10 Å such that the MR ratio is at the maximum as stated above.

Hereinafter, a method of fabricating a magnetic memory device according to an exemplary embodiment of the present invention will be described with reference to FIG. 2. As the materials and structures of respective thin layers are the same as described with reference to FIG. 2, a repeated description thereof will be omitted here.

Referring to FIG. 2, an isolation pattern is formed in a predetermined region of a semiconductor substrate to define an active region. A word line is formed on the active region across the isolation pattern. Thereafter, source and drain regions are formed in the active region between the word lines. The word line and the source and drain regions constitute a transistor, which electrically selects an MTJ pattern 100 according to an exemplary embodiment of the present invention.

A digit line DL is formed on the resultant structure having the transistor in a parallel direction to the word line. A lower electrode BE is formed on the resultant structure having the digit line DL. According to the present exemplary embodiment, before forming the lower electrode BE, a plug interconnection line is formed to electrically connect the lower electrode BE and the drain region.

An MTJ layer is formed on the lower electrode BE. The MTJ layer includes a pinning layer 110, a pinned layer 120, an insulation layer 130, a free layer 140, an MR enhancing layer 150, and a capping layer 160, which are stacked sequentially.

For example, the pinning layer 110 is an anti-ferromagnetic layer, while each of the pinned layer 120 and the free layer 140 are formed of a ferromagnetic layer. Also, the insulation layer 130 is formed of an insulating material, for example, any one of magnesium oxide and aluminum oxide. The capping layer 160 is formed of a conductive material, such as, for example, tantalum.

More specifically, the pinning layer 110 is formed of, for example, at least one material selected from the group consisting of PtMn, IrMn, MnO, MnS, MnTe, $MnF_2$, $FeF_2$, $FeCl_2$, FeO, $CoCl_2$, CoO, $NiCl_2$, NiO, and Cr. Each of the pinned layer 120 and the free layer 140 may be formed of, for example, at least one selected material from the group consisting of CoFeB, CoFe, Fe, Co, Ni, Gd, Dy, NiFe, MnAs, MnBi, MnSb, $CrO_2$, $MnOFe_2O_3$, $FeOFe_2O_3$, $NiOFe_2O_3$, $CuOFe_2O_3$, $MgOGr_2O_3$, EuO, and $Y_3Fe_5O_{12}$. Also the pinned layer 120 may be, for example, a trilayer structure including two ferromagnetic layers between which a ruthenium (Ru) layer is interposed. Further, the insulation layer 130 may be formed of, for example, magnesium oxide to a thickness of about 7 to about 10 Å.

The MR enhancing layer 150 may be formed of, for example, at least one anti-ferromagnetic material. For example, the MR enhancing layer 150 may be formed of at least one material selected from the group consisting of iridium (Ir), platinum (Pt), iron (Fe), manganese (Mn), cobalt (Co), nickel (Ni), chromium (Cr) and a combination thereof, which exhibits anti-ferromagnetism. More specifically, the MR enhancing layer 150 may be formed of, for example, at least one material selected from the group consisting of IrMn, PtMn, FeMn, MnO, MnS, MnTe, $MnF_2$, $FeF_2$, $FeCl_2$, FeO, $CoCl_2$, CoO, $NiCl_2$, NiO, and Cr. Preferably, the MR enhancing layer 150 is formed of an anti-ferromagnetic material containing Mn, for example, IrMn, PtMn, and FeMn.

The MR enhancing layer 150 may be formed to a thickness of about 1 to about 80 Å so as to prevent AFC from occurring between the MR enhancing layer 150 and the free layer 140 as described above with reference to FIGS. 3 and 4. More preferably, the MR enhancing layer 150 is formed to a thickness of about 3 to about 10 Å. To precisely control the deposited thickness, the MR enhancing layer 150 may be formed using, for example, an atomic layer deposition (ALD) technique or a chemical vapor deposition (CVD) technique.

Subsequently, the MTJ layer is patterned, thereby forming the MTJ pattern 100 on the lower electrode BE. The structure of the MTJ pattern 100 is the same as described with reference to FIG. 2. Thereafter, a bit line BL is formed on the MTJ pattern 100 across the word line and the digit line DL.

After forming the MTJ layer, the resultant structure having the MTJ layer may be thermally treated at a temperature of about 250 to about 400 Å. As a result, the above-described layers are activated (for example, the free layer 140 is crystallized), thus enhancing the characteristics of the MTJ pattern 100. Preferably, the thermal treatment is performed at a temperature of about 360° C.

Figure 5:
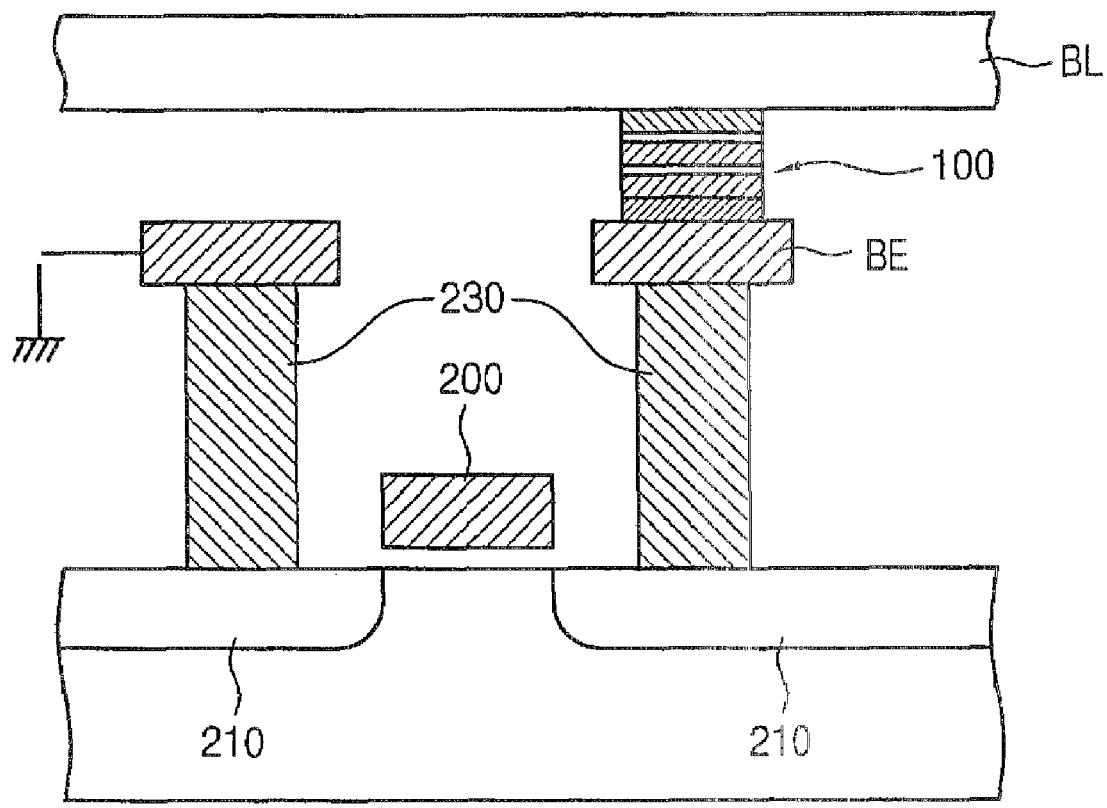
FIG. 5 is a cross sectional view of a spin-torque-transfer-type magnetic memory device.

FIG. 5 is a cross sectional view of a spin-torque-transfer-type magnetic memory device.

Referring to FIG. 5, the spin-torque-transfer-type magnetic memory device includes an MTJ 100 interposed between a bit line BL and an impurity region 210, but not a digit line DL. In this case, a plug 230 and a lower electrode BE are sequentially stacked on one side of a word line 200 to connect the MTJ 100 and the impurity region 210. The MTJ 100 is formed in the same manner and has the same structure as described above with reference to FIG. 2.

An MRAM according to exemplary embodiments of the present invention includes an MTJ having an anti-ferromagnetic layer interposed between a free layer and a capping layer. The anti-ferromagnetic layer is formed to such a thickness (for example, a thickness of about 1 to about 80 Å as described above) so as to prevent AFC from occurring between the anti-ferromagnetic layer and the free layer. As explained with reference to FIGS. 3 and 4, this anti-ferromagnetic layer not only enhances the MR characteristic of the MTJ but also reduces the required switch field strength. As a consequence, the MRAM according to exemplary embodiments of the present invention has improved characteristics over a conventional MRAM without an anti-ferromagnetic layer interposed between a free layer and a capping layer.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A magnetic memory device comprising: a pinning layer, a pinned layer, and an insulation layer sequentially stacked on a semiconductor substrate;
   a ferromagnetic free layer disposed on the insulation layer;
   a capping layer disposed on the ferromagnetic free layer; and
   an MR (magnetoresistance) enhancing layer interposed between and in direct physical contact with both the ferromagnetic free layer and the capping layer so as to prevent AFC (anti-ferromagnetic coupling) from occurring between the MR enhancing layer and the free layer, wherein the MR enhancing layer is formed of at least one anti-ferromagnetic material, wherein the MR enhancing layer is formed to a thickness of about 3 to about 10 Å using at least one material selected from the group consisting of iridium manganese (IrMn), platinum manganese (PtMn), and iron manganese (FeMn).

* * * * *